(12) United States Patent
Ito et al.

(10) Patent No.: US 6,921,881 B2
(45) Date of Patent: Jul. 26, 2005

(54) CERAMIC JOINT BODY

(75) Inventors: Yasutaka Ito, Gifu (JP); Kazuteru Ohkura, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 10/432,639

(22) PCT Filed: Aug. 12, 2002

(86) PCT No.: PCT/JP02/08223

§ 371 (c)(1),
(2), (4) Date: Nov. 6, 2003

(87) PCT Pub. No.: WO03/015157

PCT Pub. Date: Feb. 20, 2003

(65) Prior Publication Data

US 2004/0071945 A1 Apr. 15, 2004

(30) Foreign Application Priority Data

Aug. 10, 2001 (JP) ........................................ 2001-243759

(51) Int. Cl.[7] .............................................. H05B 3/68
(52) U.S. Cl. ...................................... 219/465; 219/544
(58) Field of Search ............................... 219/465, 544; 428/210, 209

(56) References Cited

U.S. PATENT DOCUMENTS

| 5,207,437 A | | 5/1993 | Barnes et al. | |
|---|---|---|---|---|
| 5,800,618 A | * | 9/1998 | Niori et al. | 118/723 E |
| 5,879,766 A | * | 3/1999 | Kato | 428/34.4 |
| 6,063,328 A | * | 5/2000 | Kato | 264/632 |
| 6,376,808 B2 | * | 4/2002 | Tachikawa et al. | 219/444.1 |
| 6,465,763 B1 | | 10/2002 | Ito et al. | |
| 6,475,606 B2 | | 11/2002 | Niwa | |
| 6,507,006 B1 | * | 1/2003 | Hiramatsu et al. | 219/444.1 |
| 6,677,557 B2 | | 1/2004 | Ito et al. | |
| 2002/0043527 A1 | | 4/2002 | Ito | |
| 2002/0043530 A1 | | 4/2002 | Ito | |
| 2002/0055021 A1 | | 5/2002 | Niwa | |
| 2003/0015521 A1 | | 1/2003 | Ito | |

FOREIGN PATENT DOCUMENTS

| EP | 0699643 | 3/1996 |
|---|---|---|
| EP | 0836221 | 4/1998 |
| EP | 1109423 | 6/2001 |
| JP | 4-324276 | 11/1992 |
| JP | 2783980 | 5/1998 |
| JP | 10-242252 | 9/1998 |
| JP | 2000-114355 | 4/2000 |
| WO | 01/47831 | 7/2001 |

* cited by examiner

*Primary Examiner*—Cathy F. Lam
(74) *Attorney, Agent, or Firm*—Oblon, Spivak, McClelland, Maier & Neustadt P.C.

(57) ABSTRACT

A ceramic joint body including a ceramic substrate and a ceramic body such as a cylindrical body firmly bonded to each other and excellent in corrosion resistance in the ceramic substrate for use for a semiconductor product producing/examining the step. The ceramic bonded body includes a ceramic substrate in which a conductor is provided, and a ceramic body bonded to a bottom face of the ceramic substrate. The ceramic bonded body has a region, where no conductor is formed, in at least a part of a region above a bonding interface between the ceramic substrate and the ceramic body.

7 Claims, 11 Drawing Sheets

CERAMIC JOINT BODY

TECHNICAL FIELD

The present invention relates to a ceramic bonded body which is used for a hot plate (a ceramic heater), an electrostatic chuck, a susceptor and the like and which comprises a ceramic substrate embedded with a conductor therein and a ceramic body such as a ceramic cylindrical body bonded to the bottom face of the substrate.

BACKGROUND ART

A heater, an electrostatic chuck and the like using a substrate made of a metal such as a stainless steel and an aluminum alloy have been conventionally used, as a semiconductor producing/examining device including an etching apparatus, a chemical vapor deposition apparatus and the like.

However, such a heater made of a metal has the following problems.

At first, since it is made of a metal, the thickness of the heater plate has to be as thick as about 15 mm. This is because, in the case of a thin metal plate, warp and strain are caused due to thermal expansion attributed to heating, so that a silicon wafer put on the metal plate is damaged or inclined. However, in the case the heater plate is made thick, there are problems that the heater becomes heavy and bulky.

Further, by changing voltage and electric current to be applied to the resistance heating element, the temperature of the face for heating (hereinafter, referred to as a heating face) an object to be heated such as a silicon wafer or the like is changed and there is also a problem that the temperature of the heating plate does not follow quickly the change of the voltage and the electric current to result in difficulty of the temperature control.

Therefore, JP Kokai Hei 4-324276 proposes a ceramic heater using an aluminum nitride, a non-oxide ceramic with a high thermal conduction and strength, as a substrate and obtained by forming a resistance heating element and conductor-filled through holes made of tungsten and welding microbe wires as external terminals to them.

Since such a ceramic heater employs a ceramic substrate with a high mechanical strength at a high temperature, the thickness of the ceramic substrate can be thinned to lessen the thermal capacity and as a result, it is made possible that the temperature of the ceramic substrate quickly follows the change of the voltage and electric current.

Further, with respect to such a ceramic heater, as disclosed in JP Kokai 2000-114355 and Japanese Patent Gazette No. 2783980, a cylindrical ceramic and a disk-like ceramic are bonded through a ceramic bonding layer so as to protect wiring of external terminals and the like from reactive gases and halogen gases to be employed for semiconductor production steps.

SUMMARY OF THE INVENTION

However, with respect to such a ceramic heater, in order to firmly bond a cylindrical ceramic and a disk-like ceramic to each other, it is indispensably required to bond them through a ceramic bonding layer or by applying a coating solution containing a sintering aid to their faces to be bonded each other.

Further, in the case of producing a bonded body by such a method, the strength of the bonded part is insufficient and the corrosion resistance of the bonded part is also insufficient and accordingly, if being exposed to reactive gases and halogen gases for a long duration, the above-mentioned disk-like ceramic is corroded and cannot stand for use and at the same time, ceramic free particles fall from it and adhere to a silicon wafer to cause free particle pollution.

The present invention has been developed to solve the above-mentioned problems, and an object thereof is to achieve a ceramic bonded body which comprises a ceramic substrate and a ceramic body of a cylindrical body or so bonded firmly to the substrate and which is provided with high corrosion resistance of the above-mentioned ceramic substrate.

A ceramic bonded body, according to the present invention, comprises: a ceramic substrate provided with a conductor; and a ceramic body bonded to a bottom face of the ceramic substrate, wherein the above-mentioned ceramic bonded body has a region where no conductor is formed in at least a part of a region above a bonding interface between the above-mentioned ceramic substrate and the above-mentioned ceramic body.

The sintering aid such as $Y_2O_3$ and the like contained in a ceramic substrate is diffused toward surface in the sintering process and therefore, in the case an electrode and a resistance heating element are formed in the inside of the ceramic substrate, the diffusion of the sintering aid toward the surface is inhibited by the electrode and the resistance heating element, and the concentration of the sintering aid in the vicinity of the region below the electrode or the resistance heating element is considerably dropped. On the other hand, the concentration of the sintering aid is high in a region under the area where no resistance heating element is formed.

In a ceramic bonded body of the present invention, the concentration of the sintering aid in the bonding interface becomes high since it has a region where no electrode and resistance heating element is formed in at least a portion of a region above the bonding interface of the above-mentioned ceramic substrate and the above-mentioned ceramic body.

Accordingly, in the case that the concentration of the sintering aid in the inside of the ceramic substrate is high, it is possible to bond a ceramic substrate and a ceramic body by heating while keeping them in direct contact with each other and in the case that heating is carried out while a sintering aid is inserted in the interface of the ceramic substrate and the ceramic body, the bonding strength between them can be increased. By carrying out bonding in such a condition, sintering proceeds in the interface and ceramic grains are bonded one another and grown so as to cross over the interface and consequently, the ceramic substrate and the ceramic body are bonded firmly.

As a result, the external terminals, electrode members of conductive wires and the like housed in the above-mentioned ceramic body can be reliably protected from corrosive gases.

With respect to a ceramic heater of the present invention, the concentration of the sintering aid of such as $Y_2O_3$ in a region above the bonding interface of the above-mentioned ceramic substrate is desirable to be high as compared with the concentration of the sintering aid of such as $Y_2O_3$ in the region under the above-mentioned resistance heating element.

It is because if the concentration of a sintering aid is high, the ceramic grains grown in the interface of a ceramic substrate and a ceramic body firmly bond the ceramic substrate and the ceramic body to give higher adhesion strength between them.

Further, the ceramic bonded body preferably comprises an electrostatic electrode, and functions as an electrostatic chuck provided with heating means. It is because the electrostatic chuck is often used in corrosive atmosphere and the structure where the above-mentioned ceramic substrate and the above-mentioned ceramic body of such as a cylindrical body are bonded as described above is the optimum.

Further, in the case of applying a ceramic bonded body of the present invention to a semiconductor producing/examining device, it is preferable: that the ceramic substrate embedding a conductor therein is fixed in the upper part of a supporting case provided with a bottom plate; and that the ceramic body (the cylindrical body) bonded to the bottom face of the above-mentioned ceramic substrate houses the wiring from the above-mentioned conductor. This is to prevent the above-mentioned wiring from being corroded attributed to the exposure to corrosive gases or the like. Incidentally, it is not necessarily required for the ceramic body to be cylindrical, and the ceramic body may be the one which is made of a ceramic as a whole and embedding the wiring therein. Also, the cylindrical body may be a hollow square pillar other than cylindrical body.

In a region above the bonding interface of the above-mentioned ceramic substrate, the area of the region where no conductor is formed is preferably 5% or more of the area of the above-mentioned bonding interface. It is because if it is less than 5%, a sintering aid is not diffused sufficiently and thus sufficient bonding strength cannot be obtained.

Further, in the region above the bonding interface of the above-mentioned ceramic substrate, the area of a region where no conductor is formed (the no conductor formed area) is more preferably 50% or more of the area of the above-mentioned bonding interface. It is because if the area of the no conductor formed area is 50% or more, diffusion of the sintering aid is further promoted to give higher bonding strength.

| Explanation of Symbols | |
| --- | --- |
| 10 | ceramic heater |
| 11 | ceramic substrate |
| 11a | heating face |
| 11b | bottom face |
| 12 | resistance heating element |
| 12a | resistance heating element terminal portion |
| 13, 13' | conductor-filled through holes |
| 14 | bottomed hole |
| 15 | through hole |
| 16 | concave portion |
| 17 | cylindrical body |
| 18 | conductor circuit |
| 19 | blind hole |
| 130 | via hole |
| 180 | temperature measuring element |

DETAILED DISCLOSURE OF THE INVENTION

Hereinafter, the present invention will be described with reference to embodiments. However, the present invention is not to be limited to the extent of the embodiments described below.

In the case a conductor formed in the inside of a ceramic substrate constituting a ceramic bonded body of the present invention is a resistance heating element and a conductor circuit, the above-mentioned ceramic bonded body functions as a ceramic heater.

Figure 1:
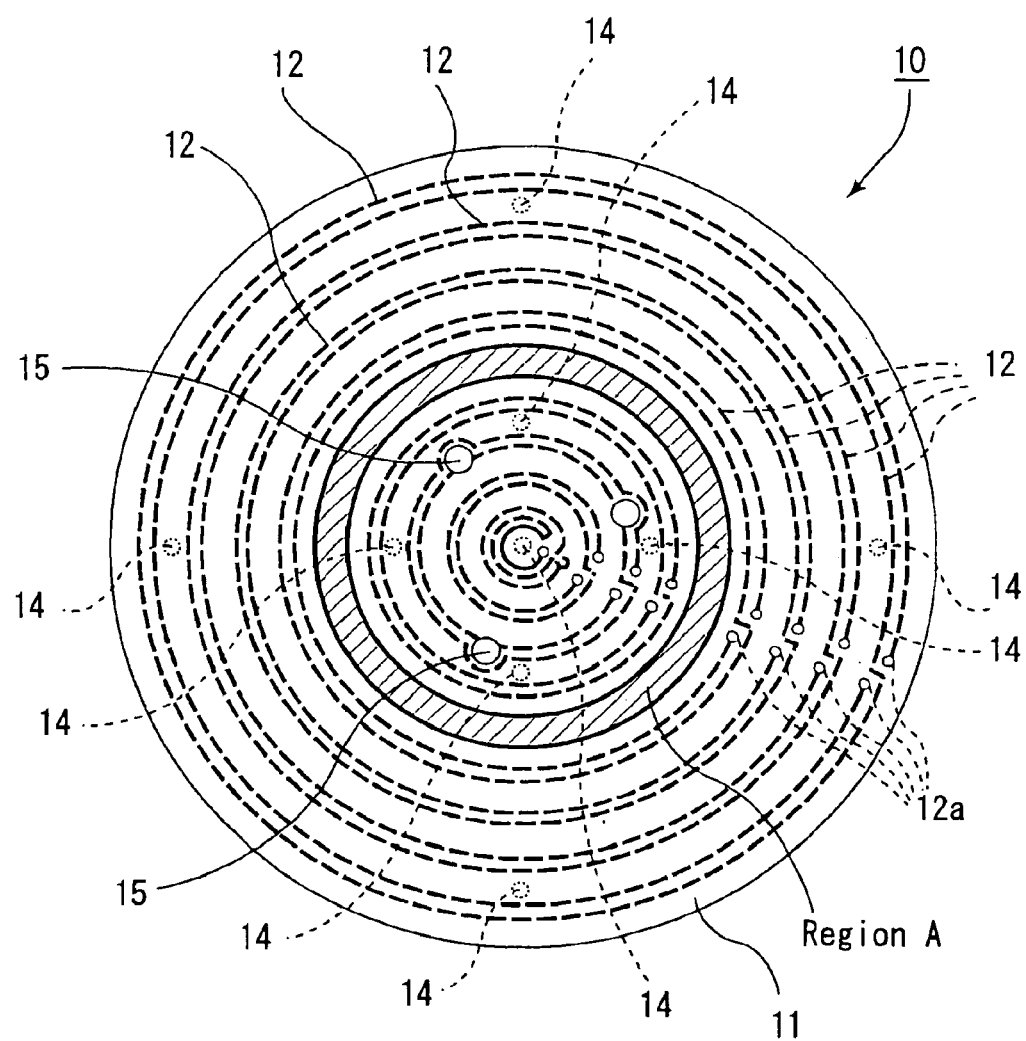
FIG. 1 is a bottom face view schematically showing a ceramic heater of an example of a ceramic bonded body of the present invention.
Figure 2:
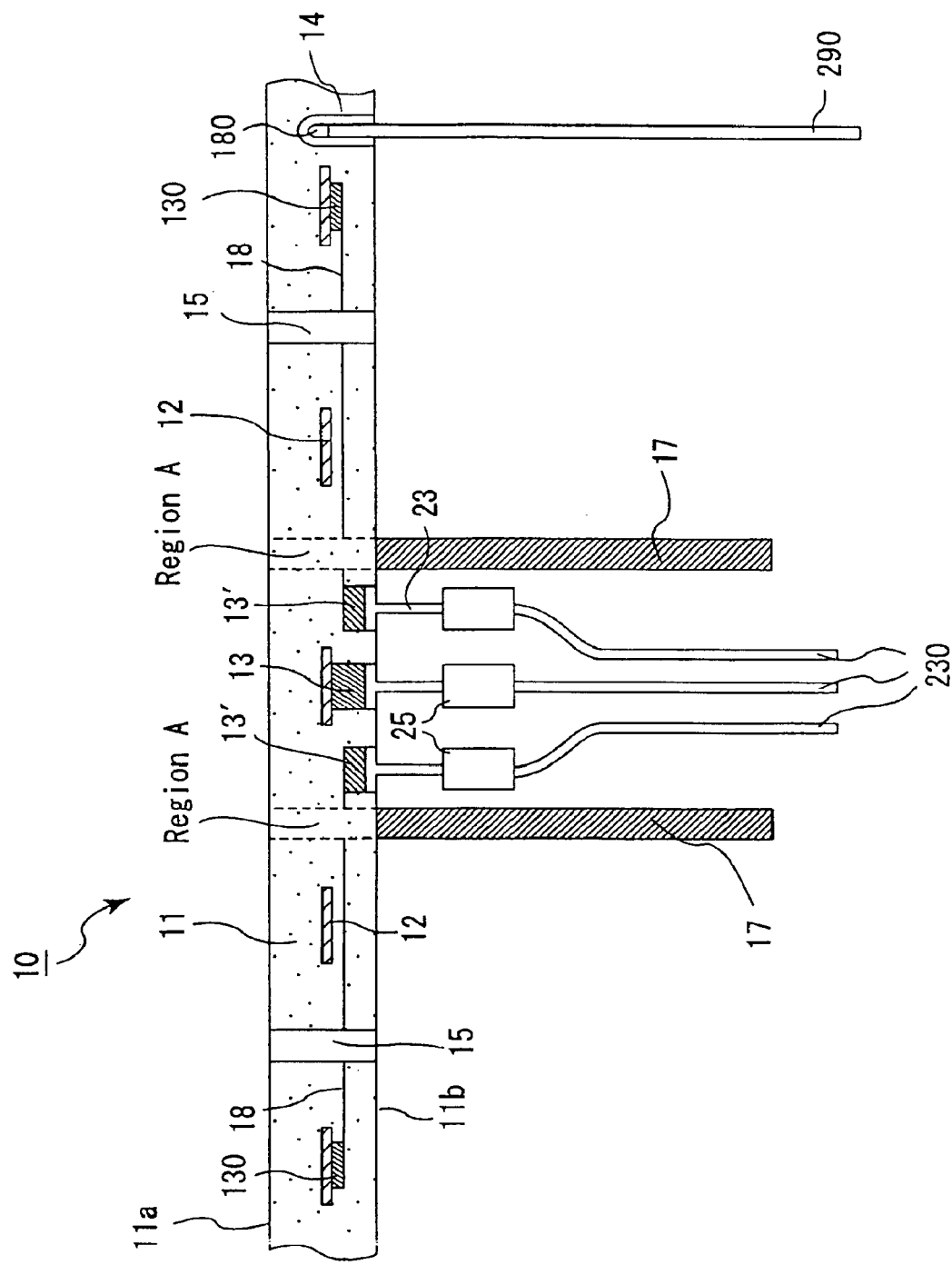
FIG. 2 is a cross-sectional view of the ceramic heater shown in FIG. 1.
Figure 3:
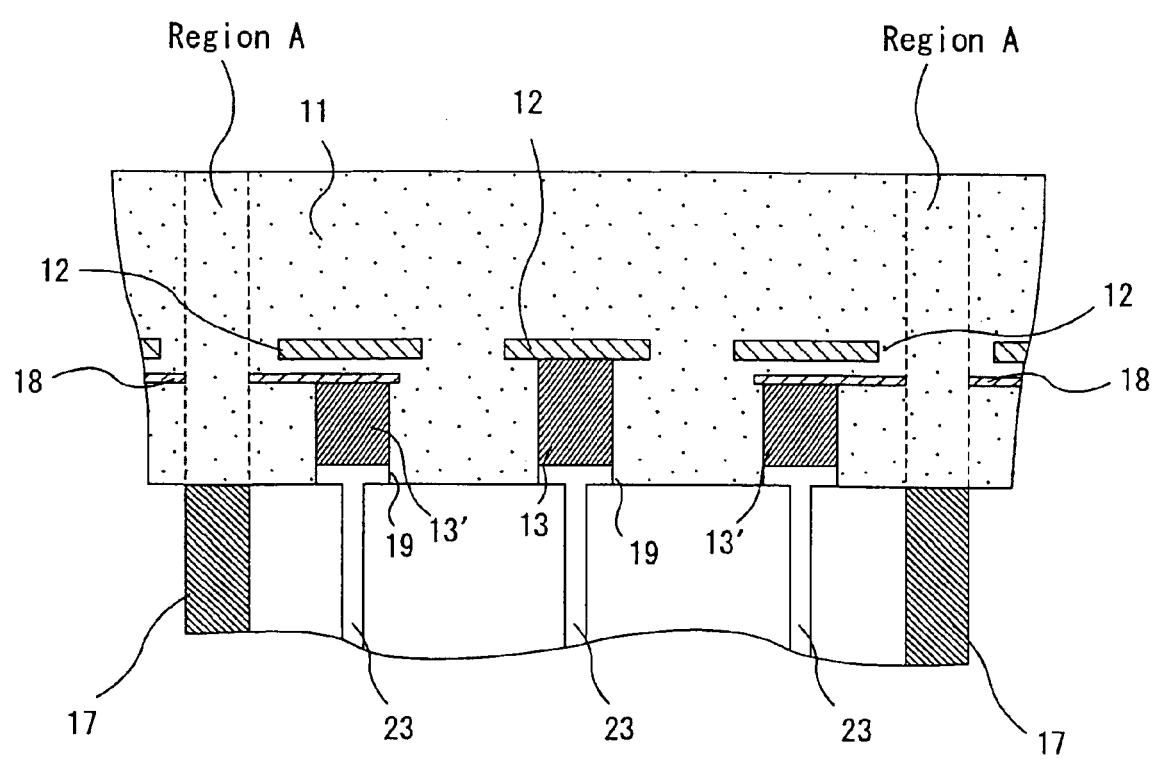
FIG. 3 is a partially enlarged cross-sectional view schematically showing the ceramic substrate constituting the ceramic heater shown in FIG. 1.

FIG. 1 is a plan view schematically showing a ceramic substrate, which is a part of a ceramic heater constituting a ceramic bonded body of the present invention: FIG. 2 is its cross-sectional view: and FIG. 3 is a partially enlarged cross-sectional view of the peripheral part of cylindrical body made of a ceramic shown in FIG. 2.

As shown in FIG. 2, in the ceramic heater 10, a cylindrical body 17 is bonded to about the center of the bottom face 11b of a disk-like ceramic substrate 11. Also, since the cylindrical body 17 is formed so as to be closely attached to a bottom plate of a supporting case (not illustrated), the inner side and the outer side of the cylindrical body 17 are completely isolated each other.

Since the bottom face 11b of the ceramic substrate 11 and the cylindrical body 17 are bonded to each other through an extremely thin bonding layer or directly without any intermediate, they are firmly bonded without causing gas permeation at the bonding portions or separation of the cylindrical body 17 when a large stress is applied.

In the inside of the ceramic substrate 11, as shown in FIG. 1, resistance heating elements 12 comprising concentrically circular circuits are formed and these resistance heating elements 12 are connected in a manner that mutually neighboring nearest circular circuits are coupled to form each single line.

However, as shown in FIG. 1 and FIG. 2, in a region above the bonding interface between the ceramic substrate 17 and the cylindrical body 17, a region A where no resistance heating element 12 is formed exists. Accordingly, a sintering aid contained in the ceramic substrate can reach the bonding interface with the cylindrical body without being inhibited by the resistance heating element during the dispersion to the substrate surface, so that the ceramic substrate and the cylindrical body made of a ceramic can be firmly bonded.

Further, as shown in FIG. 2, between the resistance heating element 12 and the bottom face 11b, conductor circuits 18 extending toward the center of the ceramic substrate 11 are formed and resistance heating element terminal parts 12a and conductor circuits 18 are connected through via holes 130.

The conductor circuits 18 are formed in order to extend the resistance heating element terminal parts 12a to the center part. In the inside of the ceramic substrate 11, conductor-filled through holes 13' and blind holes 19 for exposing the conductor-filled through holes 13' are formed immediately under the other ends of the conductor circuits 18 extended to the vicinity of the inner side of the cylindrical body 17, and the conductor-filled through holes 13' are connected with external terminals 23 having T-shaped tip parts through a solder layer (not illustrated).

Incidentally, unlike the resistance heating elements, the conductor circuits 18, which connect the resistance heating element terminal parts 12a and the conductor-filled through holes by traversing the region A, exists only in a portion of the region A but not in the entire region A, so that they do not affect the concentration distribution of $Y_2O_3$ in the ceramic substrate surface and therefore do not contradict the present invention.

In the case the resistance heating element terminal parts 12a exist in the inner side of the cylindrical body 17 since no via hole and conductor circuit are required, conductor-filled through holes 13 are formed directly at the terminal parts of the resistance heating elements and connected with external terminals 23 through a solder layer.

Then, sockets 25 having conductive wires 230 are attached to the respective external terminals 23 and the conductive wires 230 are led out to the outside via through holes formed in a bottom plate (not illustrated) and connected to an electric power source and the like (not illustrated).

On the other hand, into a bottomed hole 14 formed in the bottom face 11b of the ceramic substrate 11, a temperature measuring element 180 such as a thermocouple or the like having lead wires 290 is inserted and sealed with a heat resistant resin, a ceramic (silica gel or the like), or the like. The lead wires 290 penetrate the inside of the insulator (not illustrated) and led out to the outside via a through hole (not illustrated) formed in the bottom plate of a supporting case and the inside of the insulator is also isolated from the outside.

Further, in the vicinity of the center of the ceramic substrate 11, through holes 15 are formed in order to let lifter pins (not illustrated) pass through.

The above-mentioned lifter pins are formed so as to be moved up and down while placing an object to be treated such as a silicon wafer or the like thereon and accordingly, they are capable of transferring a silicon wafer to a transporting apparatus which is not illustrated or receiving a silicon wafer from the transporting apparatus and at the same time, heating a silicon wafer while setting the silicon wafer on a heating face 11a of the ceramic substrate 11 or heating the silicon wafer while supporting the silicon wafer above the heating face 11a at a distance of 50 to 2,000 μm from the heating face 11a.

Further, through holes and concave parts are formed in the ceramic substrate 11 and then, after: supporting pins are fixed while being slightly projected out the ceramic substrate 11, a silicon wafer is supported on the above-mentioned supporting pins, the silicon wafer may be heated at a distance of 50 to 2,000 μm from the heating face.

Incidentally, a coolant introducing pipe and the like may be laid in the bottom plate of the supporting case. In such a case, by introducing a coolant into the coolant introducing pipe through a duct, the temperature and the cooling speed of the ceramic substrate 11 can be controlled.

As described above, with respect to the ceramic heater 10, since the cylindrical body 17 is bonded to the bottom face 11b of the ceramic substrate 11 and the cylindrical body 17 is provided with a bottom plate of the supporting case (the container wall), which is not illustrated, the inner side and the outer side of the cylindrical body 17 are completely isolated from each other.

Accordingly, by protecting the conductive wires 230 led out of the through holes in the bottom plate with tubular members, even if the ambient atmosphere in the surrounding of the ceramic heater 10 contains the reactive gases, halogen gases and the like and these gases or so are apprehended to penetrate easily in the inside of the supporting case, the wiring in the inner side of the cylindrical body 17 is prevented from being corroded. Incidentally, the wiring 290 from the temperature measuring element 180 is also prevented from being corroded owing to the protection by the insulator and the like.

Further, by slowly introducing an inert gas and the like into the inner side of the cylindrical body 17 so as to prevent the reactive gases and the halogen gases from flowing in the inner side of the cylindrical body 17, corrosion of the conductive wires 230 can be further reliably prevented.

The ceramic substrate 11 preferably contains 1 to 10% by weight of $Y_2O_3$, which is a sintering aid, in the inside. It is because if the content of the above-mentioned $Y_2O_3$ is less than 1% by weight, the corrosion resistance of the ceramic substrate 11 is lowered and the adhesion strength with the cylindrical body 17 becomes insufficient, whereas, if the content exceeds 10% by weight, it results in increase of the production cost and therefore it is not practical. The content is further preferably 2 to 6% by weight.

$Al_2O_3$, CaO, $Na_2O$, $Li_2O$, $Rb_2O$ and the like can be used as a sintering aid, besides $Y_2O_3$, in the case that a nitride ceramic (aluminum nitride) is used as the substrate. C, $B_4C$ and the like can be used as a sintering aid, in the case that SiC is used as the substrate. CaO and MgO can be used as a sintering aid, in the case that $Al_2O_3$ is used as the substrate.

The ceramic substrate 11 preferably has brightness of N6 or less on the basis of standards defined by JIS Z 8721. Because those having such brightness are excellent in radiation heat and covering-up property. Further, it is made possible to accurately measure the surface temperature of a ceramic heater comprising such a ceramic substrate by a thermoviewer.

Incidentally, the brightness value N is defined as follows: the brightness of the ideal black is defined to be 0 and the brightness of the ideal white is defined to be 10 and the brightness values of respective colors are expressed by N0 to N10 by dividing the respective colors into 10 grades at equal sensible brightness difference between the brightness of the black and the brightness of the white.

The practical measurement is carried out by comparing the color with color chips corresponding to N0 to N10. In this case, the numeral of the first decimal place is either 0 or 5.

A ceramic substrate 11 having such a characteristic can be obtained by adding carbon in 100 to 5,000 ppm in the substrate. There are amorphous carbon and crystalline carbon as carbon and since the amorphous carbon can suppress the drop of the volume resistivity of the substrate at a high temperature and the crystalline carbon can suppress the drop of the thermal conductivity of substrate at a high temperature, so that the types of carbon may be properly selected based on the use of the substrate to be produced.

The amorphous carbon can be obtained by for example firing a hydrocarbon composed of only C, H, and O, preferably, saccharides, in air and as the crystalline carbon, a graphite powder or the like can be used.

Further, carbon can be obtained by thermally decomposing acrylic resin in inert gas atmosphere and then heating and pressurizing the resulting acrylic resin, and by changing the acid value of the acrylic resin, the degree of the crystallinity (amorphous property) can be adjusted.

The shape of the ceramic substrate 11 preferably has disk-like shape as shown in the illustration and the diameter is preferable to be 200 mm or more and most optimum to be 250 mm or more.

It is because the disk-like ceramic substrate 11 is required to be heated evenly and the substrate having a larger diameter tends to be heated unevenly.

The thickness of the ceramic substrate 11 is preferably 50 mm or thinner, more preferably 20 mm or thinner. The most optimum is 1 to 5 mm.

It is because if the thickness is too thin, warping easily takes place at the time of heating at a high temperature, whereas if the thickness is too thick, the thermal capacity becomes too high and therefore, the temperature rising and dropping characteristics are deteriorated.

Further, the porosity of the ceramic substrate 11 is preferably 0, or 5% or less. The above-mentioned porosity is measured by Archimedes' method.

It is because the drop of the thermal conduction at a high temperature and occurrence of warping can be suppressed.

The cylindrical body 17 has a function of firmly supporting the ceramic substrate 11 and is capable of preventing warping due to self weight even at the time of heating the ceramic substrate 11 to a high temperature, and consequently preventing damages of an object to be treated such as a silicon wafer or the like and heating the object to be treated evenly.

As a ceramic constituting the cylindrical body 17 similar ones to those above exemplified for the ceramic substrate may be used.

The cylindrical body 17 preferably contains 0 to 5% by weight of $Y_2O_3$ as a sintering aid in the inside. It is because if the content of the above-mentioned $Y_2O_3$ exceeds 5% by weight, it results in the soaring of the production cost and therefore it is not practical.

The shape of the cylindrical body in a ceramic bonded body of the present invention is preferably a circular cylindrical body and the inner diameter is preferably 10 mm or more.

It is because if it is smaller than 10 mm, it becomes difficult to firmly support the ceramic substrate and at the time of heating the ceramic substrate to a high temperature, thus the ceramic substrate may be warped due to the self weight.

Further, the thickness of the above-mentioned cylindrical body is preferably 3 to 20 mm. It is because: if the thickness is thinner than 3 mm, the thickness of the cylindrical body is too thin and the mechanical strength becomes too low and it results in high probability of break of the above-mentioned cylindrical body by repeating the temperature rise and drop; and if the thickness exceeds 20 mm, the thickness of the cylindrical body is too thick and the thermal capacity becomes high and thus it is apprehended that the temperature rising speed is lowered.

As the pattern of the resistance heating elements 12, other than the concentric circular shapes as shown in FIG. 1, a spiral shape, eccentric circular shapes, combinations of concentric circular shapes and winding lines, and the like can be exemplified. The thickness of the resistance heating elements 12 is preferably 1 to 50 μm and the width of them is preferably 5 to 20 μm.

It is because by changing the thickness and the width of the resistance heating elements 12, the resistance value of them can be changed and they are most practical for use if they are in those ranges. The resistance value of the resistance heating elements 12 becomes higher as their thickness becomes thinner and their width becomes narrower.

The resistance heating elements 12 may have any cross-sectional shape such as a square, an elliptical, a spindle-like, or a semi-circular shape, however preferably have a flat shape. It is because if they are flat, heat radiation toward the heating face 11a is easy to increase the quantity of heat to be transmitted to the heating face 11a and uneven temperature distribution in the heating face 11a is hardly caused. Additionally, the resistance heating elements 12 may have a spiral shape.

With respect to the ceramic heater 10, the number of the circuits composed of the resistance heating elements 12 is not particularly limited if it is one or more, however in order to evenly heat the heating facella, it is preferable that a plurality of circuits are formed.

In the case of forming the resistance heating elements 12 in the inside of the ceramic substrate 11, their formation positions are not particularly limited, however at least one layer is preferably formed at a position within 60% in the thickness from the bottom face 11b of the ceramic substrate 11. It is because heat is diffused while being transmitted to the heating face 11a and consequently, the temperature of the heating face 11a tends to become even.

In the case of forming the resistance heating elements 12 in the inside of the ceramic substrate 11, a conductor containing paste comprising a metal and a conductive ceramic is preferable to be used.

That is, in the case of forming the resistance heating elements 12 in the inside of the ceramic substrate 11, after a conductor containing paste layer is formed on a green sheet, a green sheet is laminated and fired to form the resistance heating elements 12 in the inside.

The foregoing conductor containing paste is not particularly limited, however it is preferable to contain a resin, a solvent, a thickener and the like other than a metal particle or a conductive ceramic in order to assure conductivity.

As the foregoing metal particle, for example, a noble metal (gold, silver, platinum, palladium), lead, tungsten, molybdenum, nickel and the like are preferable. They may be used solely or in combination of two or more of them. It is because these metals are relatively hard to be oxidized and have sufficiently high resistance values to generate heat.

As the above-mentioned conductive ceramics, for example, carbides of tungsten, carbides of molybdenum and the like can be exemplified. They may be used solely or in combination of two or more of them.

The particle size of these metal particles or conductive ceramic particles is preferably 0.1 to 100 μm. If it is finer than 0.1 μm, they are easy to be oxidized, whereas if it exceeds 100 μm, it becomes difficult to sinter them and the resistance value increases.

The shape of the above-mentioned metal particles may be spherical or scaly. In the case these metal particles are used, mixtures of the above-mentioned spherical particles and the above-mentioned scaly particles may be used.

If the above-mentioned metal particles are scaly ones or in form of mixtures of spherical and scaly ones, metal oxides are apt to be held among metal particles, so that the adhesion property between the resistance heating elements 12 and the ceramic substrate 11 is assured and the resistance value can be high and therefore, that is advantageous.

As the resin to be used for the conductor containing paste, for example, an epoxy resin, a phenol resin and the like can be exemplified. Further, as the solvent, for example, isopropyl alcohol and the like can be exemplified. As the thickener, cellulose and the like can be exemplified.

Further, in the case of forming the conductor circuits 18 in the inside of the substrate, besides a conductor containing paste containing a metal or a conductive ceramic used for formation of the above-mentioned resistance heating elements 12, conductor containing pastes commonly used for forming electrodes and the like can be used.

The size of the conductor circuits 18 is not particularly limited and the width and the thickness are preferably 0.1 to 50 mm and 0.1 to 500 μm, respectively and the length of the conductor circuit may be properly adjusted corresponding to the distance from the end parts of the resistance heating elements 12 to the inner side of the cylindrical body 17 bonded to close to the center of the ceramic substrate 11.

A ceramic heater 10 according to the present invention is preferably used at 100° C. or more, more preferably used at 200° C. or more.

In the present invention, the conductive wires 230 connected to the external terminals 23 through sockets 25 are preferably coated with heat resistant insulating members in order to prevent short circuit with another conductive wire 230.

As such insulating members, aluminum nitride similar to the cylindrical body 17 and besides that, oxide ceramics such as alumina, silica, mullite, cordierite and the like, silicon nitride, silicon carbide and the like can be exemplified.

With respect to a ceramic heater 10 shown in FIGS. 1, 2, and 3, generally, a ceramic substrate 11 is fitted in the upper part of a supporting case (not illustrated), however in another embodiment, a substrate may be set on the upper face of a supporting case having a substrate receiving part at the upper end and fixed by fixing members such as bolts and the like.

In the present invention, as shown in FIG. 2, a thermocouple can be used as the temperature measuring element 180. It is because the temperature of the resistance heating elements 12 is measured by the thermocouple and temperature control is made possible by changing the voltage and electric current based on the obtained data.

The size of the bonding portion of the lead wires of the above-mentioned thermocouple is either the same as or more than the diameter of element wires of the respective lead wires and it is preferably 0.5 mm or less. With such constitution the thermal capacity of the bonding portion is lowered and the temperature can be precisely and quickly converted into current value. Therefore, the temperature controllability can be improved and the temperature distribution of the heating face 11a for a wafer can be narrowed.

As the above-mentioned thermocouple, for example, as exemplified in JIS-C-1602 (1980), K-type, R-type, B-type, E-type, J-type, and T-type thermocouples can be included.

Other than the above-mentioned thermocouples, as the temperature measuring means of the ceramic heater 10 according to the present invention, for example, temperature measuring elements such as a platinum-based temperature measuring resistor, a thermistor and the like can be exemplified and also a temperature measuring element using an optical means such as a thermoviewer and the like can be exemplified.

In the case of using the above-mentioned thermoviewer, the temperature of the heating face 11a of the ceramic substrate 11 can be measured and besides, the temperature of the surface on an object to be heated such as a silicon wafer can be directly measured, so that the precision of the temperature control for the object to be measured can be improved.

The ceramic substrate constituting a ceramic bonded body of the present invention is to be employed for producing a semiconductor and examining a semiconductor. Practical examples thereof include those of an electrostatic chuck, a susceptor, a hot plate (a ceramic heater) and the like.

The above-mentioned ceramic heater is an equipment comprising a ceramic substrate in which only resistance heating elements are embedded in the inside and accordingly, it can hold an object to be treated such as a silicon wafer or the like, on the surface of the ceramic substrate or while being separated from the surface and heat, the wafer to a prescribed temperature or clean the wafer.

In the case conductors embedded in the inside of a ceramic substrate constituting a ceramic bonded body of the present invention are electrostatic electrodes or conductor circuits, the above-mentioned ceramic bonded body functions as an electrostatic chuck.

Figure 4:
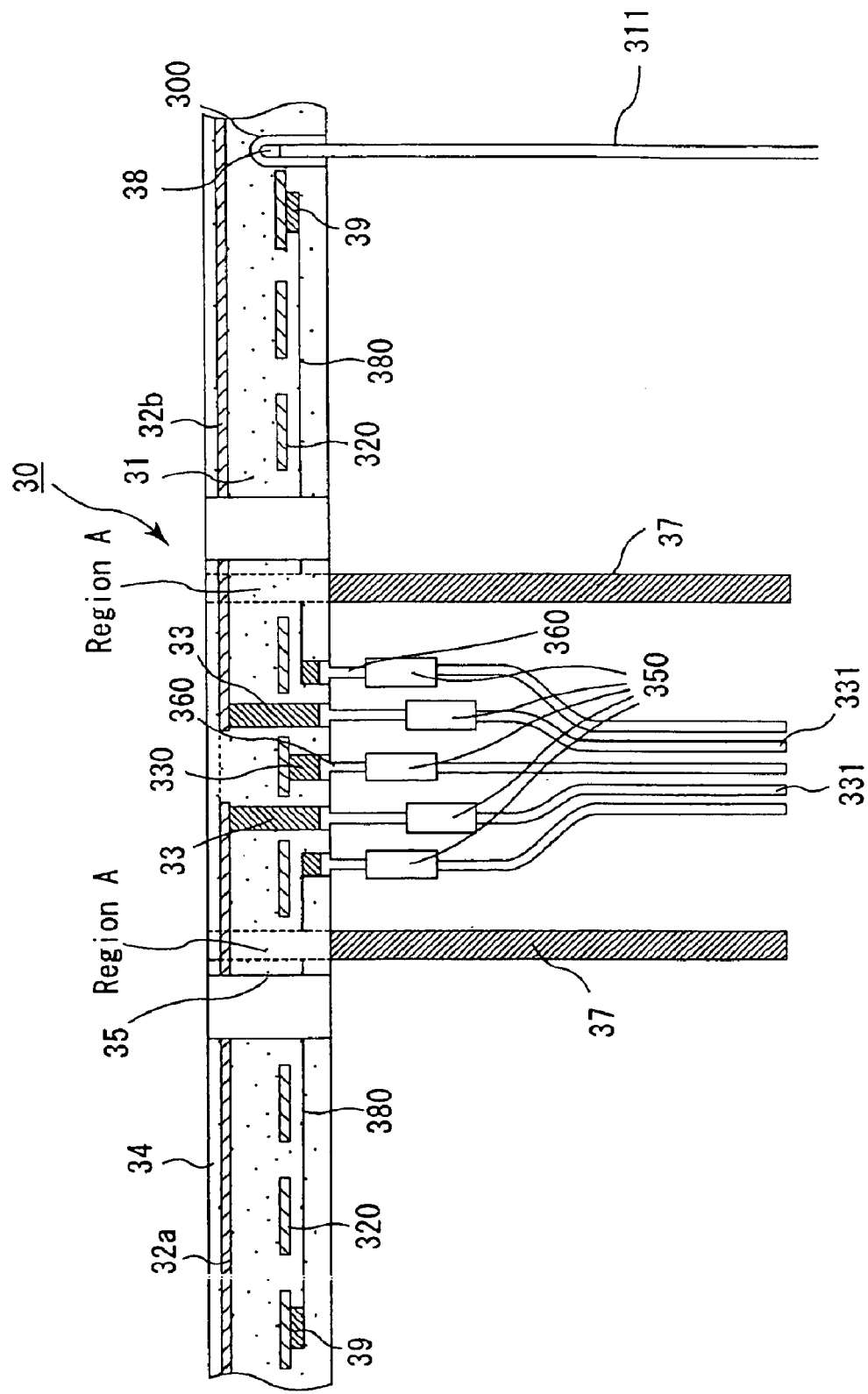
FIG. 4 is a vertical cross-sectional view schematically showing a ceramic substrate constituting an electrostatic chuck of one example of a ceramic bonded body of the present invention.
Figure 5:
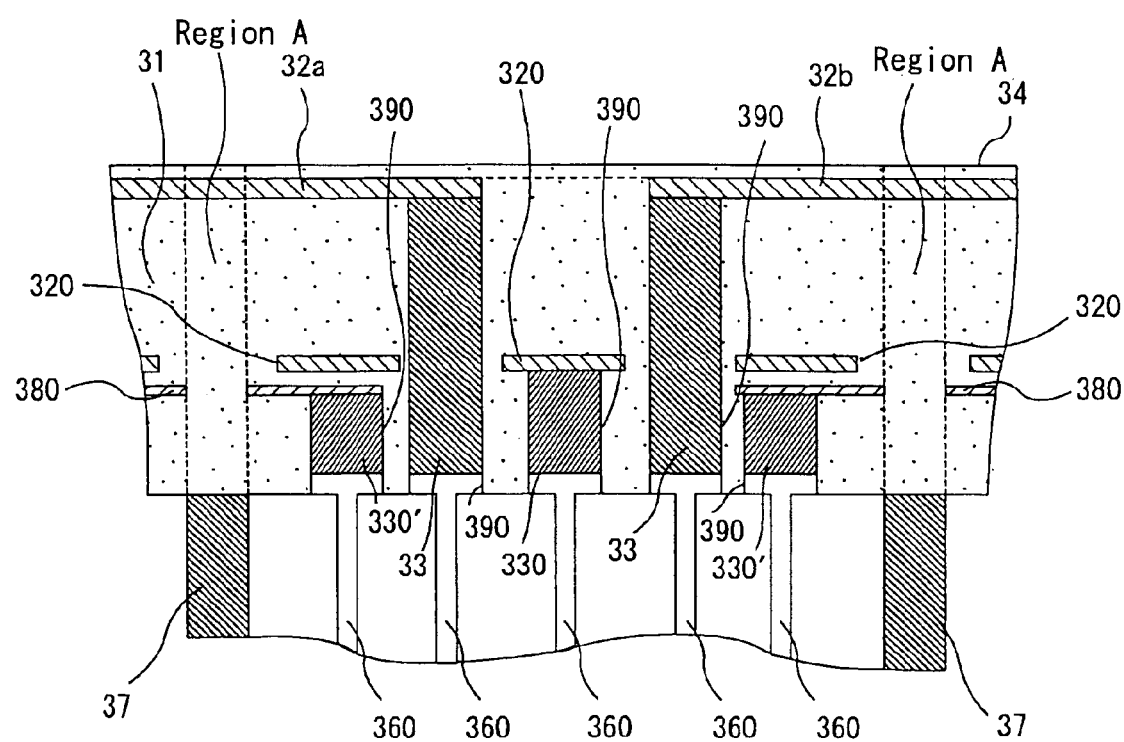
FIG. 5 is a partially enlarged cross-sectional view schematically showing the ceramic substrate constituting the electrostatic chuck shown in FIG. 4.
Figure 6:
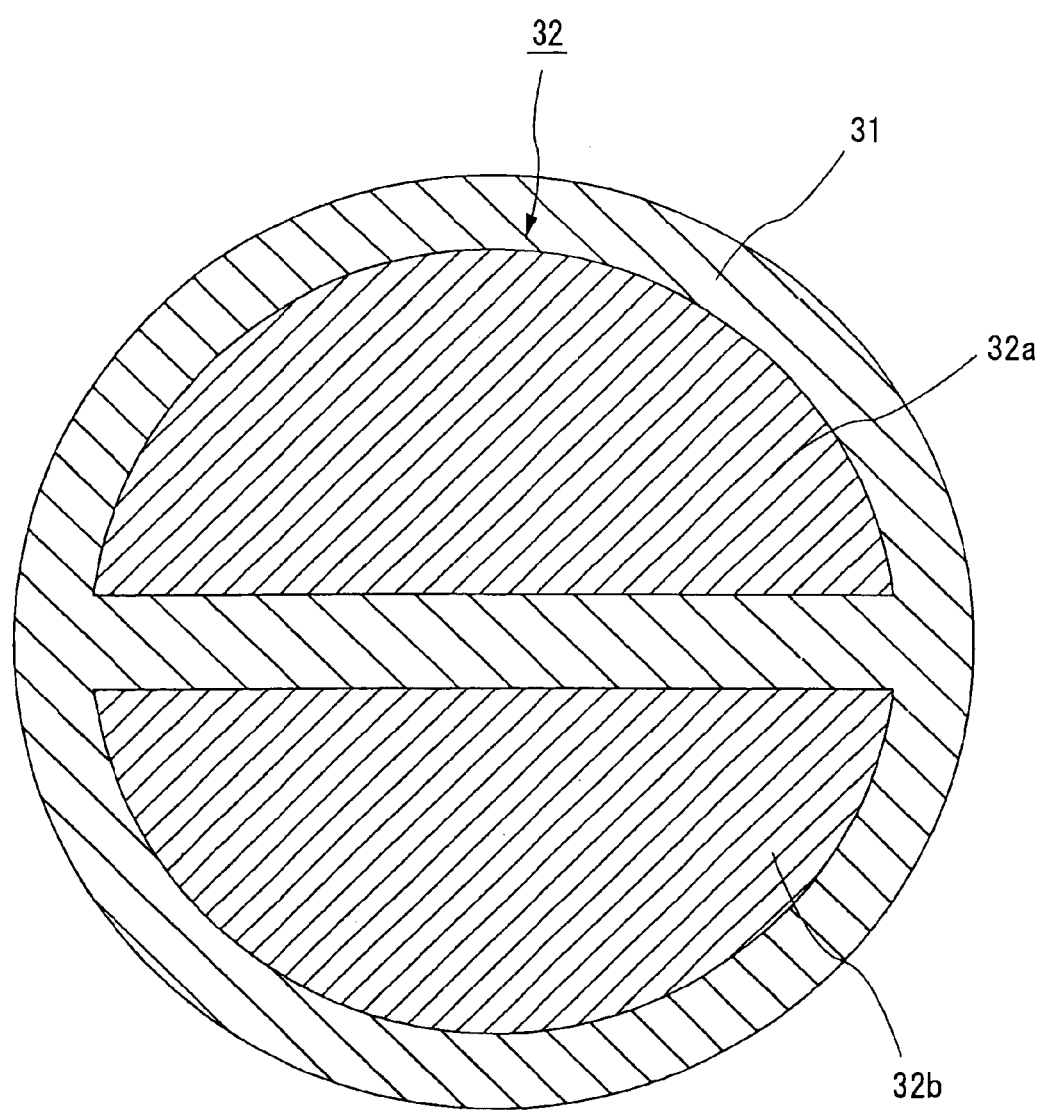
FIG. 6 is a horizontal cross-sectional view schematically showing one example of an electrostatic electrode embedded in a ceramic substrate.

FIG. 4 is a vertical cross-sectional view schematically showing such an electrostatic chuck, FIG. 5 is a partially enlarged cross-sectional view of the electrostatic chuck and FIG. 6 is a horizontal cross-sectional view schematically showing the peripheral part of the electrostatic electrode formed in the substrate constituting the electrostatic chuck.

In the inside of the ceramic substrate 31 constituting the electrostatic chuck 30, semi-circular chuck positive and negative electrostatic layers 32a 32b are arranged on the opposite to each other and a ceramic dielectric film 34 is formed on these electrostatic electrodes. Further, in the inside of the ceramic substrate 31, resistance heating elements 320 are formed so as to heat an object to be heated such as a silicon wafer or the like. Incidentally, based on the necessity, an RF electrode may be embedded in the ceramic substrate 31.

The above-mentioned electrostatic electrodes are preferably made of a metal such as noble metal (gold, silver, platinum, palladium), lead, tungsten, molybdenum, nickel and the like or a conductive ceramic such as carbides of tungsten and molybdenum. They may be used solely or in combination of two or more of them.

As shown in FIG. 4 and FIG. 5, the electrostatic chuck 30 is composed similarly to the above described ceramic heater 10, except that electrostatic electrodes 32a, 32b are formed in the ceramic substrate 31 and conductor-filled through holes 33 are formed immediately under the end parts of the electrostatic electrodes 32a, 32b and the ceramic dielectric film 34 is formed on the electrostatic electrodes 32.

That is, a cylindrical body 37 is bonded to about the center of the bottom face of the ceramic substrate 31, conductor-filled through holes 33, 330 are formed above the inner side of the cylindrical body 37 and connected to the electrostatic electrodes 32a, 32b, the resistance heating elements 320 and also to external terminals 360 inserted into blind holes 390, and one ends of the external terminals 360 are connected with sockets 350 having conductive wires 331. The conductive wires 331 are led out to the outside of through holes (not illustrated).

Further, in the case of the resistance heating elements 320 having terminal parts in the outside of the cylindrical body 37, similar to the case of the ceramic heater 10 shown in FIG. 1 to FIG. 3, via holes 39, conductor circuits 380, and conductor-filled through holes 330' are formed, so that the end parts of the resistance heating elements 320 are extended to the inner side of the cylindrical body 37 (see FIG. 5). Accordingly, by inserting the external terminals 360 into the blind holes 390 for exposing the conductor-filled through holes 330' and connecting them, the external terminals 360 can be housed in the inner side of the cylindrical body 37.

In the case of operating the electrostatic chuck 30, voltage is applied respectively to the resistance heating elements 320 and the electrostatic electrodes 32. Accordingly, a silicon wafer set on the electrostatic chuck 30 can be heated to a prescribed temperature and electrostatically attracted to the ceramic substrate 31. Additionally, the electrostatic chuck is not necessarily provided with the resistance heating elements 320.

Figure 7:
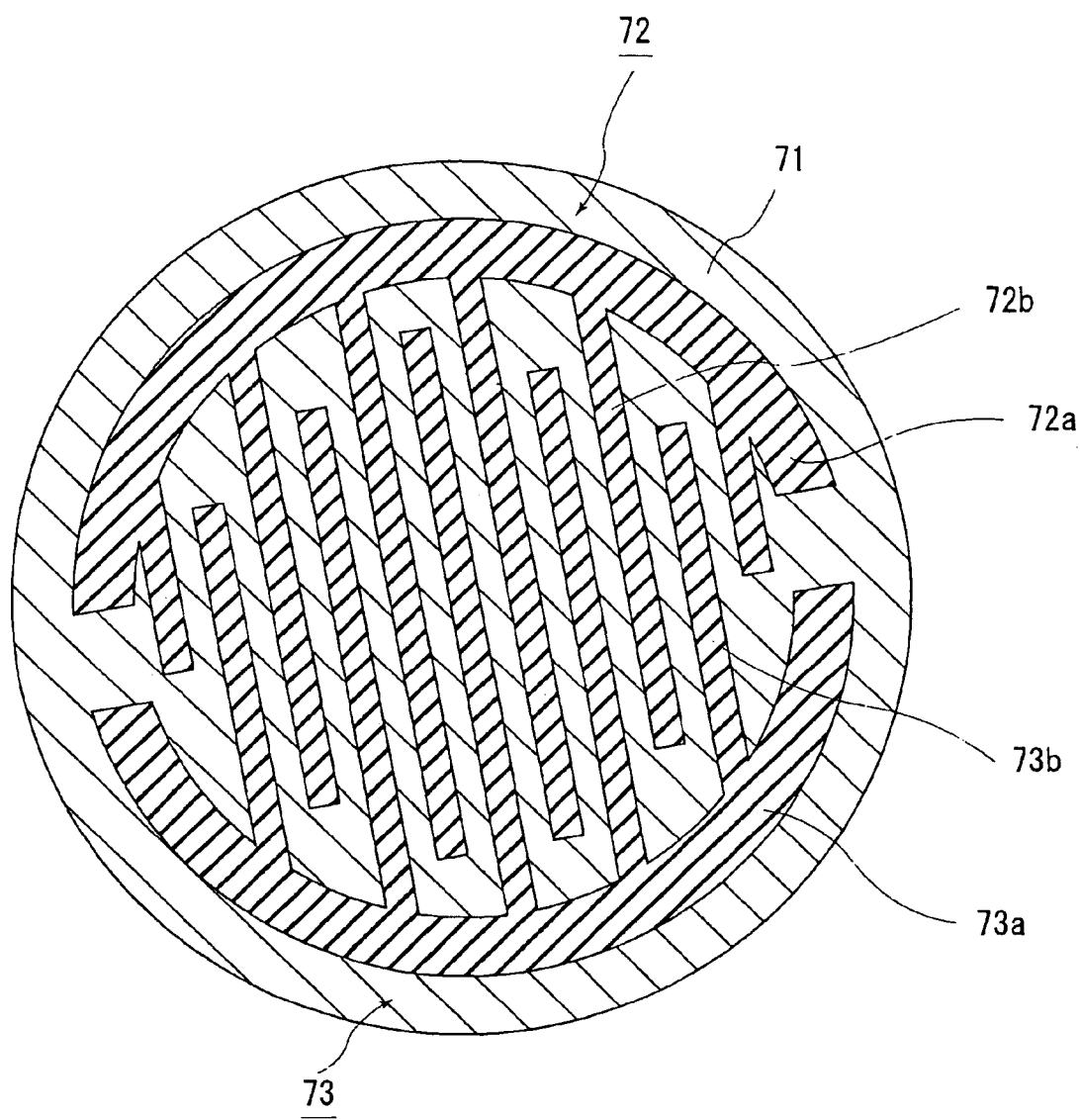
FIG. 7 is a horizontal cross-sectional view schematically showing another example of an electrostatic electrode embedded in a ceramic substrate.

FIG. 7 is a horizontal cross-sectional view schematically showing an electrostatic electrode formed on a substrate of another electrostatic chuck. A chuck positive electrode electrostatic layer 72 composed of a semicircular arc part 72a and comb teeth shaped part 72b and a similar chuck negative electrode electrostatic layer 73 composed of a semicircular arc part 73a and comb teeth shaped part 73b are arranged face-to-face in such a manner that the teeth of one comb teeth shaped part 72b extend in staggered relation with the teeth of the other comb teeth shaped part 73b.

Figure 8:
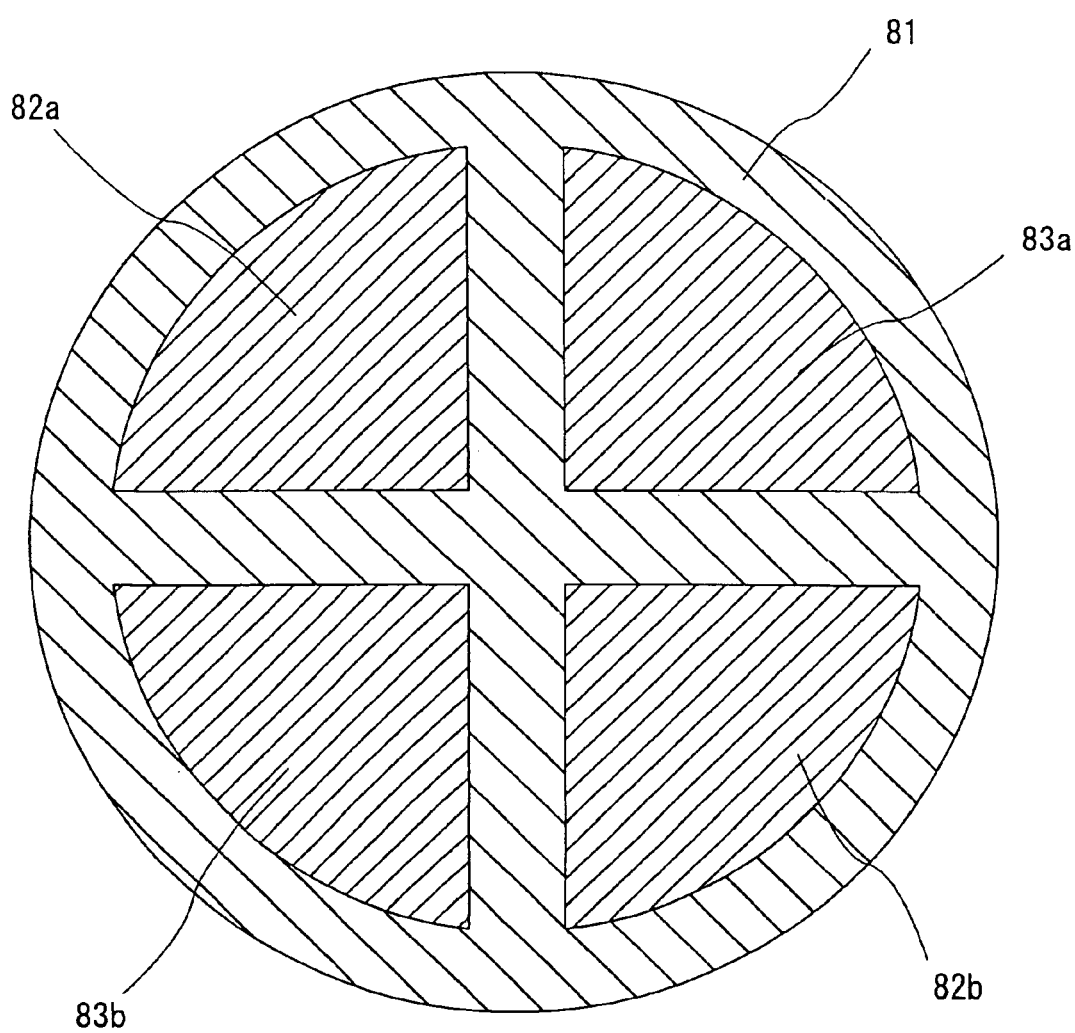
FIG. 8 is a horizontal cross-sectional view schematically showing further another example of an electrostatic electrode embedded in a ceramic substrate.

Further, FIG. 8 is a horizontal cross-sectional view schematically showing an electrostatic electrode formed on a substrate of another electrostatic chuck. In the electrostatic chuck, chuck positive electrode electrostatic layers 82a, 82b and chuck negative electrode electrostatic layers 83a, 83b with a shape formed by dividing a circle into four are formed in the inside of a substrate 81. These two chuck positive electrode electrostatic layers 82a, 82b and two chuck negative electrode electrostatic layers 83a, 83b are formed so as to cross each other.

Additionally, in the case of forming electrodes with a shape formed by dividing a circle, the number of the divided portions is not particularly limited and 5-divided portions or more may be formed and also, the shape is not limited to a sector.

Next, a production method of the ceramic heater will be described below with reference to FIG. 9, as one example of a production method of a ceramic bonded body of the present invention.

FIGS. 9(a) to 9(d) show cross-sectional views schematically showing parts of the production method of a ceramic heater having resistance heating elements in the inside of a substrate comprising aluminum nitride.

(1) Step of Producing Green Sheet

First, ceramic powder of an aluminum nitride or the like is mixed with a binder, a solvent and the like to prepare a paste. This is used to form green sheets.

In this case, $Y_2O_3$ as a sintering aid is added to the above-mentioned green sheet.

Also, as the binder, at least one binder selected from an acrylic binder, ethyl cellulose, butyl cellosolve, and polyvinyl alcohol is preferable.

Further, as the solvent, at least one solvent selected from α-terpineol and glycol is preferable.

The paste obtained by mixing them is formed into a sheet-like shape by a doctor blade method to obtain the green sheet 50.

The thickness of the green sheet 50 is preferable to be 0.1 to 5 mm.

Next, a green sheet having portions 630 to be via holes for connecting the terminal parts of resistance heating elements and conductor circuits; and a green sheet having portions to be conductor-filled through holes for connecting the conductor circuits and external terminals: are produced.

Further, based on the necessity, portions to be through holes for letting lifter pins for transporting a silicon wafer pass through; portions to be through holes for inserting supporting pins for supporting a silicon wafer; and a portion to be a bottomed hole for embedding a temperature measuring element such as a thermocouple: are formed. Incidentally, the process of forming the conductor-filled through holes and the bottomed hole may be conducted after a green sheet laminated body is formed or after the laminated body is formed and fired.

Additionally, the portions to be via holes 630 and the portions 63, 63' to be conductor-filled through holes may be filled with a paste obtained by adding carbon to the above-mentioned paste. It is because carbon in the green sheet is reacted with tungsten or molybdenum filled in the conductor-filled through holes and their carbides are formed.

(2) Step of Printing Conductor Containing Paste on Green Sheet

On the green sheet having portions 630 to be via holes, a metal paste or a conductor containing paste containing a conductive ceramic is printed to form a conductor containing paste layer 62.

At that time, the conductor containing paste is not printed on the region corresponding to the upper part of a cylindrical body 17 to be bonded. In such a manner, by forming resistance heating elements in the region other than the region above the bonding interface with the cylindrical body, the sintering aid contained in the ceramic substrate 11 can reach the cylindrical body bonding portion without being interrupted by the resistance heating elements 12 during the diffusion to the surface, so that the ceramic substrate 11 and the cylindrical body 17 made of a ceramic can be firmly bonded to each other.

Incidentally, a metal particle or a conductive ceramic particle is mixed in these conductor containing pastes.

The average particle size of a tungsten particle or a molybdenum particle, which is the above-mentioned metal particle, is preferably 0.1 to 5 μm. It is because if the average particle size is smaller than 0.1 μm or more than 5 μm, printing of the conductor containing pastes becomes difficult.

Examples of such a conductor containing paste include a composition (a paste) containing: 85 to 87 parts by weight of a metal particle or a conductive ceramic particle; 1.5 to 10 parts by weight of a binder selected from at least one of an acrylic resin binders, ethyl cellulose, butyl cellosolve, polyvinyl alcohol; and 1.5 to 10 parts by weight of a solvent selected from at least one of α-terpineol and glycol.

Further, a conductor containing paste layer 68 is formed by printing a conductor containing paste commonly used for the case of forming electrostatic electrodes and the like on the green sheet having portions 63, 63' to be conductor-filled through holes.

(3) Step of Laminating Green Sheet

On the green sheet on which the conductor containing paste 62 is printed, a plurality of green sheets 50 on which no conductor containing paste is printed are laminated and a green sheet having the conductor layer 68 is laminated in the lower face of the resulting laminate of green sheets. Further, in the lower face of the green sheets, a plurality of green sheets 50 on which no conductor containing paste is printed are laminated (FIG. 9(*a*)).

In this case, the number of the green sheets 50 to be laminated on the upper side of the green sheet on which the conductor containing paste 62 is printed is adjusted to be larger than that of the green sheets 50 to be laminated on the lower side of the green sheet so that the position where the resistance heating elements are formed is prejudiced toward the bottom face. Practically, the number of the green sheets 50 laminated in the upper side is preferably 20 to 50 and the number of the green sheets 50 laminated in the lower side is preferably 5 to 20.

(4) Step of Firing Green Sheet Lamination

Figure 9:
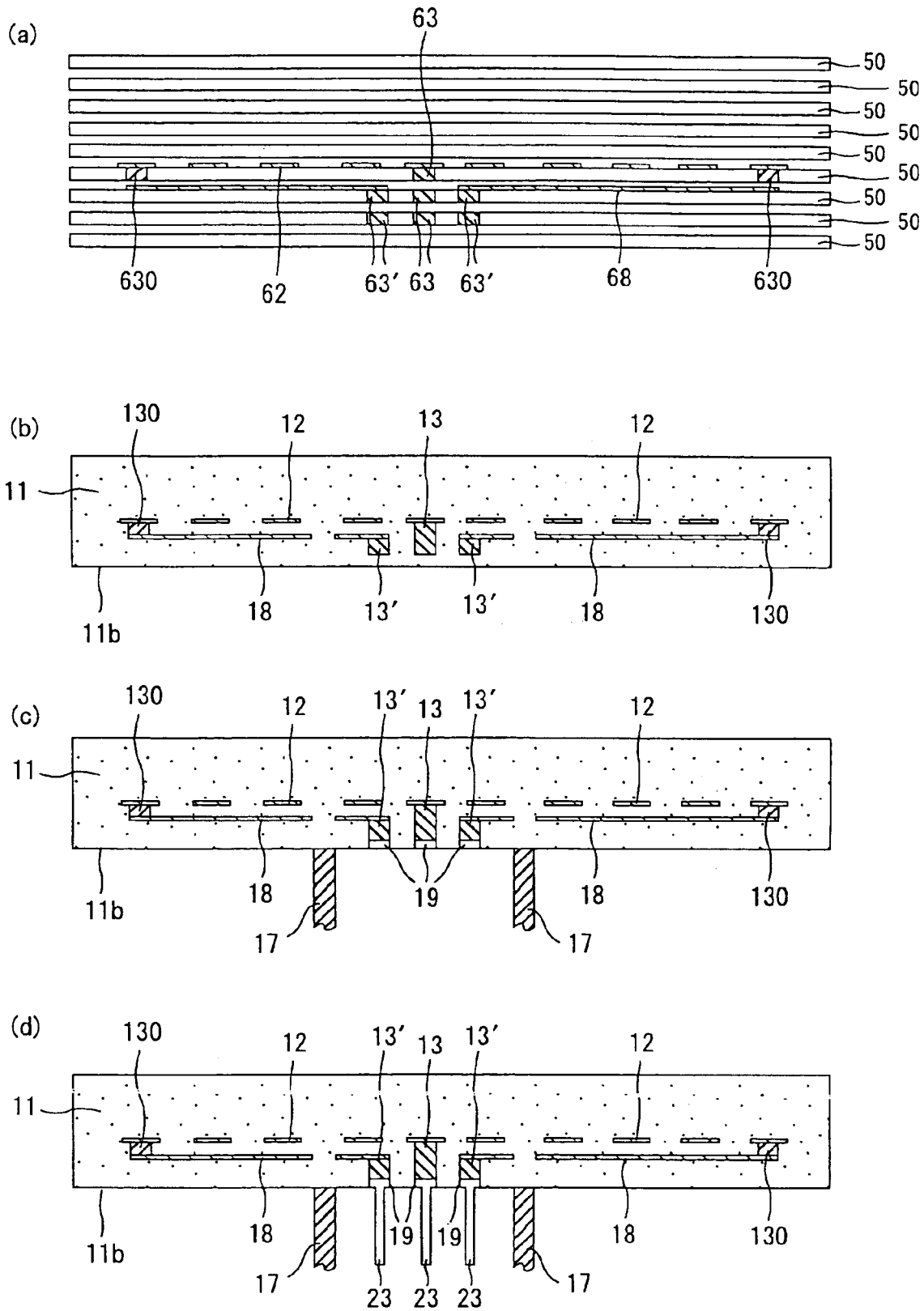
FIGS. 9(a) to 9(d) are cross-sectional views schematically showing a ceramic heater manufacturing method of one example of a ceramic bonded body of the present invention.

The obtained green sheet lamination is heated and pressurized to sinter the conductor containing paste layers 62, 68 in the inside of the green sheets 50 to produce the ceramic substrate 11, the resistance heating elements 12, the conductor circuits 18 and the like (see FIG. 9(*b*)).

The heating temperature is preferably 1,000 to 2,000° C. and the pressurizing pressure is preferably 10 to 20 MPa. Heating is carried out in inert gas atmosphere. Examples of the inert gas includes argon, nitrogen or the like.

Next, in the bottom face 11b of the ceramic substrate 11, a bottomed hole for inserting a temperature measuring element is formed (not illustrated). The above-mentioned bottomed hole can be formed by carrying out drilling or blast treatment such as sand blast. Incidentally, the above-mentioned bottomed hole and a concave part may be formed after the ceramic substrate 11 and a cylindrical body 17 are bonded to each other, which will be described later, or may be formed by previously forming a portion to be a bottomed hole in a green sheet 50 and simultaneously carrying out the formation by layering and firing green sheets 50.

Further, blind holes 19 are formed to expose the conductor-filled through holes 13, 13' for forming connection with the resistance heating elements 12 in the inside. The blind holes 19 may be also formed after the ceramic substrate 11 and a cylindrical body 17 are bonded to each other.

(5) Production of Cylindrical Body

An aluminum nitride powder is put in a cylindrical molding die and molded and if necessary, subjected to cutting process. The obtained body is sintered at a heating temperature of 1,000 to 2,000° C. in normal pressure to produce a cylindrical body 17 made of a ceramic. The above-mentioned sintering is carried out in inert gas atmosphere. As the inert gas, for example, argon, nitrogen or the like can be used.

In this case, as a sintering aid, $Y_2O_3$ is added to the above-mentioned aluminum nitride powder. It is because the ceramic substrate and the cylindrical body can be directly bonded to each other well.

The size of the cylindrical body 17 is adjusted so as to have the conductor-filled through holes 13, 13' formed in the inside of the ceramic substrate in the inner side of the cylindrical body.

Incidentally, the ceramic substrate and the cylindrical body can be bonded directly to each other regardless of the concentration of the sintering aid in the bonding interface of the ceramic substrate by further increasing the amount of $Y_2O_3$ contained in the above-mentioned cylindrical body, however, if a ceramic bonded body is produced by such a manner, it requires troublesome procedures and it results in soaring production cost and therefore, it is not practical.

Next, the end face of the cylindrical body 17 is polished to be leveled.

(6) Bonding Between Ceramic Substrate and Cylindrical Body

In the case the concentration of the sintering aid is high in the bonding portion of the ceramic substrate 11 and the bonding portion of the cylindrical body 17, the ceramic substrate 11 and the cylindrical body 17 can be bonded to each other by heating the ceramic substrate 11 and the cylindrical body 17 while bringing the vicinity of the center of the bottom face 11b of the ceramic substrate 11 and the end face of the cylindrical body 17 into contact with each other.

In the case the concentration of the sintering aid is not so high in the bonding portion of the ceramic substrate 11 and the bonding portion of the cylindrical body 17, after a solution containing a sintering aid is applied to the bonding portion of the bottom face 11b of the ceramic substrate 11 and the end face of the cylindrical body 17, the ceramic substrate 11 and the cylindrical body 17 are heated, so that they can be bonded to each other. At that time, the cylindrical body 17 is bonded to the bottom face 11b of the ceramic substrate so as to have, the conductor-filled through holes 13, 13' formed in the inside of the ceramic substrate, in the inside of the inner diameter of the cylindrical body 17 (FIG. 9(*c*)).

The ceramic substrate 11 and the cylindrical body 17 are preferably heated to 1,500 to 2,000° C. It is because $Y_2O_3$ in the ceramic substrate 11 can be diffused in the cylindrical body 17 and aluminum nitride grains can be well grown in the interface between the ceramic substrate 11 and the cylindrical body 17 and thus the ceramic substrate 11 and the cylindrical body 17 are firmly bonded to each other.

(7) Attachment of Terminal or the Like

External terminals 23 are inserted into blind holes 19 formed in the inside of the inner diameter of the cylindrical body 17 through a solder or a brazing material and heated to carry out reflow of the solder or the brazing material to connect the external terminals 23 to the conductor-filled through holes 13, 13' (FIG. 9(*d*)).

The heating temperature is preferably 90 to 450° C. in the case of a soft treatment and 900 to 1,100° C. in the case of a brazing material.

Next, conductive wires 230 to be connected with an electric power source through sockets are connected to the external terminals 23 (see FIG. 2).

Further, a thermocouple or the like as a temperature measuring element is inserted into a formed bottomed hole and sealing with a heat resistant resin is carried out to produce a ceramic heater comprising the cylindrical body made of the ceramic at the bottom face and in which no resistance heating element is formed in a region above the bonding interface between the ceramic substrate and the cylindrical body.

In the ceramic heater, after a semiconductor wafer such as a silicon wafer is put thereon or a silicon wafer or the like is held by lifter pins or supporting pins, the silicon wafer or the like can be cleaned by heating and cooling it.

At the time of producing the above-mentioned ceramic heater, an electrostatic chuck can be produced, by forming electrostatic electrodes in the inside of the ceramic substrate. Incidentally, in this case, it is required to form conductor-filled through holes for connecting the electrostatic electrodes and external terminals, however it is no need to form a through hole to insert a supporting pin into.

In the case of forming electrodes in the inside of the ceramic substrate, similar to the case of forming the resistance heating elements, a conductor containing paste layer to be an electrostatic electrode may be formed on the green sheet surface.

Hereinafter, the present invention will be described further in details.

BEST MODE FOR CARRYING OUT THE INVENTION

Example 1

Production of an Electrostatic Chuck (see FIGS. 4 to 6)

(1) Green sheets with a thickness of 0.47 mm were obtained by forming a composition obtained by mixing 100 parts by weight of an aluminum nitride powder (produced by Tokuyama Corporation, average particle size of 1.1 $\mu$m), 4 parts by weight of $Y_2O_3$ (average particle size of 0.4 $\mu$m), 12 parts by weight of an acrylic resin-based binder, 0.5 parts by weight of a dispersant, and 53 parts by weight of alcohol consisting of 1-butanol and ethanol by a doctor blade method.

(2) Next, after the green sheets were dried at 80° C. for 5 hours, the following green sheets were formed: green sheets which were not processed, the green sheets having through holes for via holes for connecting resistance heating elements and conductor circuits by punching, the green sheets having through holes for via holes for connecting conductor circuits and external terminals, and the green sheets having through holes for via holes for connecting electrostatic electrodes and external terminals.

(3) A conductor containing paste A was produced by mixing 100 parts by weight of a tungsten carbide particle having an average particle size of 1 $\mu$m, 3.0 parts by weight of an acrylic binder, 3.5 parts by weight of α-terpineol solvent, and 0.3 parts by weight of a dispersant.

Also, a conductor containing paste B was produced by mixing 100 parts by weight of a tungsten particle having an average particle size of 3 $\mu$m, 1.9 parts by weight of an acrylic binder, 3.7 parts by weight of α-terpineol solvent, and 0.2 parts by weight of a dispersant.

(4) Further, the above-mentioned conductor containing paste A was printed on the surface of a green sheet having through holes for via holes for connecting conductor circuits and external terminals, by a screen printing method to form a conductor containing paste layer to be the resistance heating elements. Incidentally, in the above-mentioned step, no conductor containing paste A was printed on the region above the portion to which a cylindrical body was to be bonded. Further, a conductor containing paste layer in form of the electrostatic electrode pattern with a shape shown in FIG. 6 was formed in green sheets which were not subjected to any processing.

Further, the through holes for via holes for connecting the resistance heating elements and the conductor circuits, and the through holes for conductor-filled through holes for connecting to the external terminals were filled with the conductor containing paste B.

The respective green sheets subjected to the above-mentioned processing, respectively, were laminated.

At first, on the upper side (the heating face side) of a green sheet printed with the conductor containing paste layer to be resistance heating elements, 34 green sheets having portions to be conductor-filled through holes 33 were laminated and on the lower side (the bottom face side), a green sheet having a conductor containing paste layer to be the conductor circuits was laminated and further 12 green sheets having portions to be the conductor-filled through holes 33, 330, 330' were laminated in the further lower side.

A green sheet printed with a conductor containing paste layer in form of the electrostatic electrode pattern was laminated further on the uppermost part of the green sheets laminated in such a manner and moreover, 2 green sheets which were subjected to no processing were laminated thereon and the resulting green sheets were pressure-bonded to one another at 130° C. in 8 MPa pressure to obtain a laminated body.

(5) Next, the obtained laminated body was degreased at 600° C. for 5 hours in nitrogen gas and after that, hot pressed in conditions of 1,890° C. for 5 hours in 15 MPa pressure to obtain a 3 mm-thick aluminum nitride plate body.

The plate body was cut into a disk-like shape with a diameter of 230 mm to obtain a ceramic substrate 31 comprising resistance heating elements 320 with a thickness of 5 $\mu$m and a width of 2.4 mm, conductor circuits 380 with a thickness of 20 $\mu$m and a width of 10 mm, and a chuck positive electrode electrostatic layer 32a and a chuck negative electrode electrostatic layer 32a with a thickness of 6 $\mu$m.

(6) Next, after the ceramic substrate 31 obtained in the step (5) was ground by a diamond grindstone, a mask was put thereon and a bottomed hole 300 for a thermocouple was formed in the surface by blast treatment by glass beads and portions above where the conductor-filled through holes were formed in the bottom face 31b of the ceramic substrate 31 were hollowed out to form blind holes 390.

(7) A granule was produced by a spray drying method using a composition obtained by mixing 100 parts by weight of an aluminum nitride powder (produced by Tokuyama Corporation, average particle size of 1.1 $\mu$m), 4 parts by weight of $Y_2O_3$ (average particle size of 0.4 $\mu$m, 11.5 parts by weight of an acrylic resin-based binder, 0.5 parts by weight of a dispersant, and 53 parts by weight of alcohol consisting of 1-butanol and ethanol and the granule was put in a pipe-like die, sintered at 1,890° C. in a normal pressure and its end face was polished to have a surface roughness Ra of 0.5 $\mu$m and to obtain a cylindrical body made of aluminum nitride and having a length of 200 mm, an outer diameter of 52 mm, and an inner diameter of 39 mm.

(8) After that, an aqueous solution of 0.05 mol/L yttrium chloride was applied to the region where no resistance heating element 32 was formed in the bottom face 31b of the ceramic substrate 31 by a screen printing method, the end face of the cylindrical body was brought into contact with the region and heated at 1,890° C. to bond the ceramic substrate 31 and the cylindrical body 37. The cylindrical body 37 was bonded so as to have the blind holes 390 in the inside of the inner diameter.

(9) Next, using a Ag/Ni brazing material (Ag: 80% by weight, Ni: 20% by weight, reflow temperature: 1000° C.), external terminals 360 were attached to the blind holes 390 in the inner side of the cylindrical body 37. Conductive wires 331 were connected to the external terminals 360 through sockets 350.

(10) After that, a thermocouple for controlling the temperature was inserted into the bottomed hole 300 and silica sol was filled in the hole and cured to let gelation occur at 190° for 2 hours so as to produce a ceramic bonded body comprising: the ceramic substrate capable of working as an electrostatic chuck and having the electrostatic electrodes, the resistance heating elements, the conductor circuits, and via holes and conductor-filled through holes; and a cylindrical body made of aluminum nitride and bonded to the bottom face of the substrate.

Example 2

Production of a Ceramic Heater (see FIGS. 1 to 3 and FIG. 9)

(1) Green sheets with a thickness of 0.47 mm were obtained by forming a composition obtained by mixing 100 parts by weight of an aluminum nitride powder (produced by Tokuyama Corporation, average particle size of 1.1 $\mu$m), 4 parts by weight of yttrium oxide ($Y_2O_3$:yttria average particle size of 0.4 $\mu$m), 11.5 parts by weight of an acrylic resin-based binder, 0.5 parts by weight of a dispersant, and 53 parts by weight of alcohol consisting of 1-butanol and ethanol by a doctor blade method.

(2) Next, after the green sheets were dried at 80° C. for 5 hours, portions 15 to be through holes for letting lifter pins pass through to transport a silicon wafer, portions to be via holes 630, and portions to be conductor-filled through holes 63, 63' were formed by punching as shown FIG. 1.

(3) A conductor containing paste A was produced by mixing 100 parts by weight of a tungsten carbide particle having an average particle size of 1 $\mu$m, 3.0 parts by weight of an acrylic binder, 3.5 parts by weight of α-terpineol solvent, and 0.3 parts by weight of a dispersant.

Also, a conductor containing paste B was produced by mixing 100 parts by weight of a tungsten particle having an average particle size of 3 $\mu$m, 1.9 parts by weight of an acrylic binder, 3.7 parts by weight of α-terpineol solvent, and 0.2 parts by weight of a dispersant.

The conductor containing paste A was printed on the green sheets, having the portions 630 to be via holes, by a screen printing method to form a conductor containing paste layer 62 for resistance heating elements. The printed pattern was adjusted to be the concentric circular pattern as shown in FIG. 1 and the width of the conductor containing paste layer 62 was adjusted to be 10 mm and the thickness was adjusted to be 12 $\mu$m.

Successively, the conductor containing paste A was printed on the green sheet shaving the portions 63' to be conductor-filled through holes, by a screen printing method to form a conductor containing paste layer 68 for conductor circuits. The printed pattern was adjusted to be belt-like shape.

In the above-mentioned step, no conductor containing paste A was printed on the region to be above the part where the cylindrical body would be bonded.

The conductor containing paste B was filled in the portions 630 to be via holes and the portions 63, 63' to be conductor-filled through holes.

On the upper side (the heating face side) of a green sheet printed with the conductor containing paste layer 62 and subjected to the above-mentioned treatment, 37 green sheets printed with no conductor containing paste were laminated and on the lower face of the resulting green sheets, further 12 green sheets printed with no conductor containing paste were laminated, and the resulting green sheets were pressure-bonded to one another at 130° C. in 8 MPa pressure to obtain a laminated body.

(4) Next, the obtained laminated body was degreased at 600° C. for 5 hours in nitrogen gas, hot pressed in conditions of 1,890° C. for 10 hours in 15 MPa pressure to obtain a 3 mm-thick aluminum nitride plate body.

The plate body was cut into a disk-like shape with a diameter of 230 mm to obtain a ceramic substrate 31 comprising resistance heating elements 12 having a thickness of 6 $\mu$m and a width of 10 mm, conductor circuits 18 with a thickness of 20 $\mu$m and a width of 10 mm, and via holes 130 and conductor-filled through holes 13, 13'.

(5) Next, portions where the conductor-filled through holes 13, 13' were formed in the bottom face 11b of the ceramic substrate 11 by the step (4) were hollowed out to form blind holes 19.

(6) A granule was produced by a spray drying method using a composition obtained by mixing 100 parts by weight of an aluminum nitride powder (produced by Tokuyama Corporation, average particle size of 1.1 $\mu$m), 4 parts by weight of $Y_2O_3$ (average particle size of 0.4 $\mu$m), 11.5 parts by weight of an acrylic resin-based binder, 0.5 parts by weight of a dispersant, and 53 parts by weight of alcohol consisting of 1-butanol and ethanol and the granule was put in a pipe-like die, sintered at 1,890° C. in a normal pressure and its end face was polished to have a surface roughness RA of 0.5 $\mu$m so as to obtain a cylindrical body 17 made of aluminum nitride and having a length of 200 mm, an outer diameter of 52 mm, and an inner diameter of 39 mm.

(7) After that, an aqueous solution of 0.05 mol/L yttrium chloride was applied to the region where no resistance heating element 12 was formed in the bottom face 11b of the ceramic substrate 11 by a screen printing method, the end face of the cylindrical body 17 was brought into contact with the region and heated at 1,890° C. to bond the ceramic substrate 11 and the cylindrical body 17. The cylindrical body 17 was bonded so as to have the blind holes 19 in the inside of the inner diameter thereof.

(8) Next, using a Ag/Ni brazing material (Ag: 80% by weight, Ni: 20% by weight), external terminals 23 were attached to the blind holes 19 in the inner side of the cylindrical body 17. Conductive wires 230 were connected to the external terminals 23 through sockets 25.

(9) After that, a thermocouple for controlling the temperature was inserted into the bottomed hole 14 and silica sol was filled in the hole and cured to let gelation occur at 190° C. for 2 hours so as to produce a ceramic bonded body comprising the ceramic substrate capable of functioning as a ceramic heater comprising: the resistance heating elements, the conductor circuits, and via holes and conductor-filled through holes; and a cylindrical body made of aluminum nitride bonded to the bottom face of the substrate.

Example 3

Figure 10:
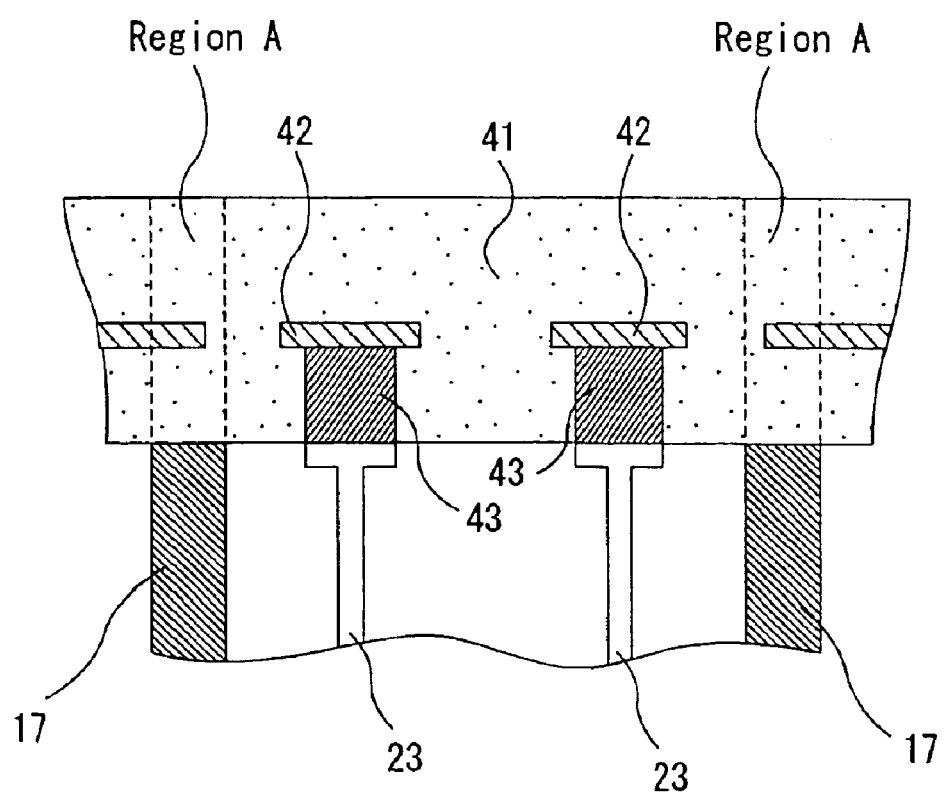
FIG. 10 is a partially enlarged cross-sectional view schematically showing a ceramic substrate constituting a ceramic heater according to Example.

In this example, as shown in FIG. 10, a ceramic bonded body 42 was produced in the same manner as Example 1, except that patterns were formed so as to make resistance heating elements 42 exist in a large portion of the region (region A) above the bonding interface of the cylindrical body 17 and the ceramic substrate 41 (80% of the area of the bonding interface in a plan view, accordingly, the region where no resistance heating element existed was 20%). Incidentally, the resistance heating elements 42 were bonded with external terminals 23 via through holes 43 by a Ag/Ni brazing material (not illustrated).

COMPARATIVE EXAMPLE 1

A ceramic heater was produced in the same manner as Example 1, except that the conductor containing paste A was printed to form a concentric resistance heating element also on the region above the portion where the cylindrical body was to be bonded in the step (4) of Example 1.

COMPARATIVE EXAMPLE 2

A ceramic heater was produced in the same manner as Example 2, except that the conductor containing paste A was printed to form a concentric resistance heating element also on the region above the portion where the cylindrical body was to be bonded in the step (3) of Example 2.

COMPARATIVE EXAMPLE 3

A ceramic heater was produced in the same manner as Example 1, except that the ceramic substrate 31 and the cylindrical body 37 were bonded to each other through a ceramic bonding layer by applying a conductor containing paste produced by mixing 100 parts by weight of a tungsten particle (produced by Tokuyama Corporation, average particle size of 1.1 $\mu$m), 4 parts by weight of yttrium oxide ($Y_2O_3$: yttria, average particle size of 0.4 $\mu$m), 11.5 parts by weight of an acrylic resin-based binder, 0.5 parts by weight of a dispersant, and 53 parts by weight of alcohol consisting of 1-butanol and ethanol to the bonding portions of the ceramic substrate 31 and the cylindrical body 37 and then heating at 1,890° C. in the step (8) of Example 1.

With respect to the ceramic bonded bodies respectively obtained in Examples 1 to 3 and Comparative Examples 1 to 3, the following evaluation tests were carried out and the results were shown in the following Table 1.

(1) Measurement of Breaking Strength

A bending strength test was carried out to measure the breaking strength of the bonded face.

(2) Heat Cycle Test

Whether cracking in the bonding portion of each cylindrical body and ceramic substrate would take place or not was confirmed by repeating a heat cycle wherein the temperature was kept at 25° C. and then raised to 450° C. for 500 times.

(3) Evaluation of Corrosion Resistance $CF_4$ gas was blown to the bonding portion of each ceramic substrate and cylindrical body of each ceramic bonded body of Examples and Comparative Examples and occurrence of corrosion was observed by eye observation.

TABLE 1

| | Breaking strength (MPa) | Heat cycle test | Occurrence of corrosion | Ratio of the area of non conductor formed area (%) |
|---|---|---|---|---|
| Example 1 | 500 | Cracking Not occurred | Not observed | 100 |
| Example 2 | 540 | Cracking Not occurred | Not observed | 83 |
| Example 3 | 440 | Cracking Not occurred | Not observed | 5 |
| Comparative Example 1 | 300 | Cracking occurred | Observed | 0 |
| Comparative Example 2 | 200 | Cracking occurred | Observed | 0 |
| Comparative Example 3 | 240 | Cracking occurred | Observed | 0 |

As being made clear from the results shown in the above-mentioned Table 1, the ceramic bonded bodies of Examples 1 to 3 had sufficiently high bonding strength on the basis of the breaking strength and no cracking took place in the heat cycle test.

Also, in the bonding portions of the ceramic substrates and the cylindrical bodies, no corrosion by $CF_4$ gas was caused.

On the other hand, with respect to the ceramic heaters of Comparative Examples 1 and 2, the adhesion strength was inferior and cracking took place in all of the ceramic heaters. Also, in the bonding portions of the ceramic heaters, portions corroded by $CF_4$ gas were observed.

It is supposedly attributed to that with respect to the ceramic heaters of Comparative Examples 1, 2, since resistance heating elements were formed in the region above the bonding interface of the ceramic substrates and the cylindrical bodies, the sintering aid contained in the ceramic substrates was interrupted by the resistance heating elements from diffusing to the surface of the substrates to result in low concentration of the sintering aid in the bonding interface as compared with that in the ceramic heaters according to Examples 1 and 2.

Further, with respect to the ceramic heater according to Comparative Example 3, cracking and corrosion were found occurring in the interface of the ceramic bonding layer with the ceramic substrate and the cylindrical body.

TEST EXAMPLE 1

A plurality of types of ceramic heaters were produced in the same manner as Example 1 except for the following. That is, the ratio of: the area of a region above the bonding interface, at which no resistance heating element was formed (the no conductor formed area); to the above-mentioned area of the bonding interface, was variously changed at the time of printing the conductor containing paste to be the resistance heating elements in the step (4) of Example 1, and the respective obtained ceramic heaters were subjected to the bending strength test to measure the breaking strength of the respective bonded faces. The results were shown in FIG. 11.

Figure 11:
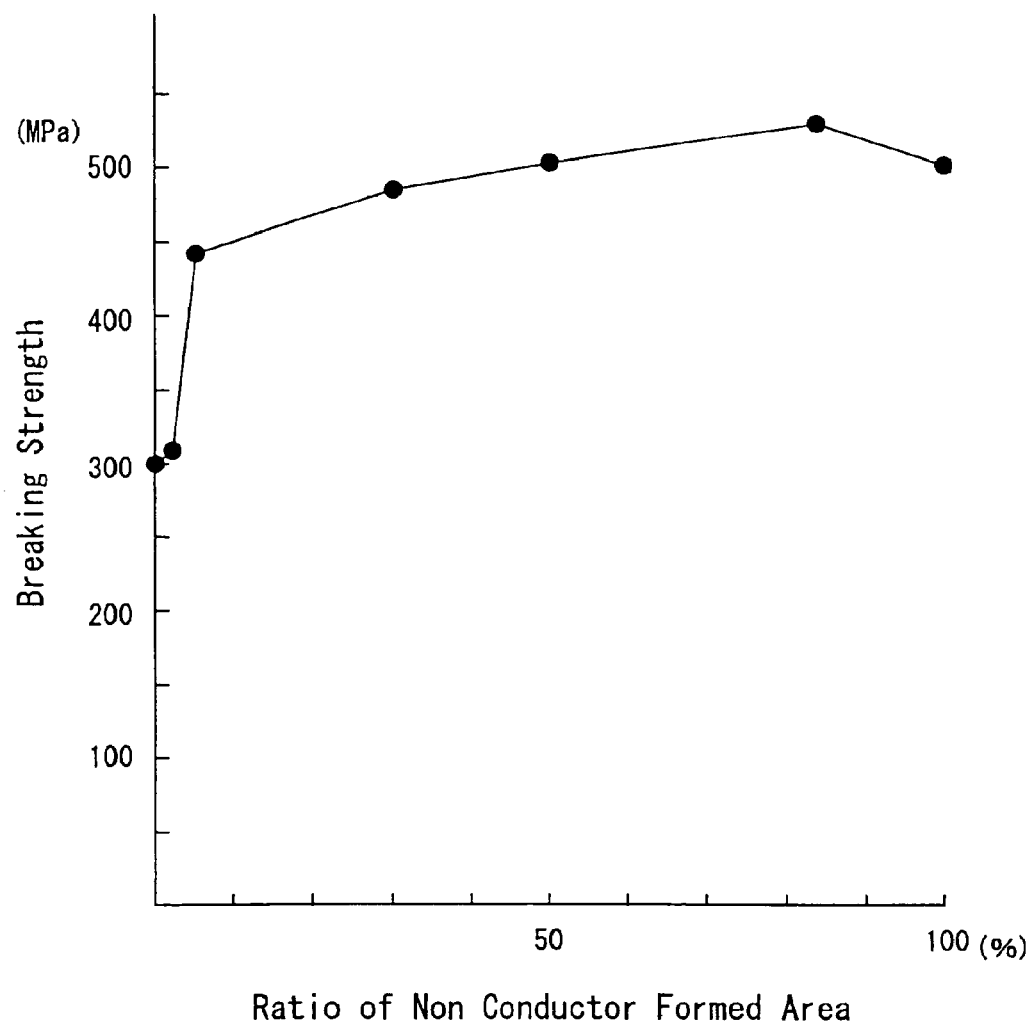
FIG. 11 is a graph showing the correlation between the ratio of a non conductor formed area and the breaking strength in a bending strength test.

As being made clear from the results shown in FIG. 11, it was found that when the ratio of the no conductor formed area was 5% or more, the adhesion strength was sharply increased.

It was supposedly attributed to that when the ratio of the no conductor formed area was 5% or more, the sintering aid was sufficiently diffused and the concentration of the sintering aid in the bonding interface was increased to result in high adhesion strength.

Further, it was also found that if the ratio of the no conductor formed area exceeded 50%, a breaking strength exceeding 500 MPa even at 600° C. was obtained.

INDUSTRIAL APPLICABILITY

As described above, in a ceramic bonded body of the present invention, a resistance heating element is formed in the region other than the region above the bonding interface of a ceramic substrate and a cylindrical body, so that a sintering aid contained in the ceramic substrate is not inhibited by the resistance heating element from diffusing to the substrate surface and can reach the bonding interface with the cylindrical body and accordingly, the ceramic substrate and the cylindrical body made of a ceramic can be firmly bonded to each other.

What is claimed is:

1. A ceramic bonded body comprising:
a ceramic substrate containing a sintering aid;
a conductor provided in said ceramic substrate; and
a ceramic body bonded to a bottom face of said ceramic substrate;
wherein said ceramic bonded body has a region where no conductor is formed in at least a part of a region above a bonding interface between said ceramic substrate and said ceramic body, said at least a part of the region is 5% or more of the area of the bonding interface; and
a concentration of the sintering aid in said region above the bonding interface of said ceramic substrate is higher than a concentration of the sintering aid in a region below said conductor.

2. The ceramic bonded body according to claim 1, wherein the ceramic bonded body further comprises an electrostatic electrode, and functions as an electrostatic chuck.

3. The ceramic bonded body according to claim 1, wherein said ceramic substrate and said ceramic body comprise a nitride ceramic.

4. The ceramic bonded body according to claim 1, wherein said conductor is a resistance heating element.

5. The ceramic bonded body according to claim 1, wherein said ceramic body does not contain a sintering aid prior to sintering.

6. The ceramic bonded body according to claim 1, wherein said ceramic body contains not more than 5% by weight of a sintering aid within said ceramic body calculated according the weight of said ceramic body.

7. The ceramic bonded body according to claim 1, wherein said ceramic body is cylindrical.

* * * * *

UNITED STATES PATENT AND TRADEMARK OFFICE
CERTIFICATE OF CORRECTION

PATENT NO. : 6,921,881 B2  Page 1 of 1
APPLICATION NO. : 10/432639
DATED : July 26, 2005
INVENTOR(S) : Ito et al.

It is certified that error appears in the above-identified patent and that said Letters Patent is hereby corrected as shown below:

On the title page, Item (75), the second inventor's last name is incorrect. Item (75) should read:
-- (75) Inventors: Yasutaka Ito, Gifu (JP); Kazuteru Okura, Gifu (JP) --

Signed and Sealed this

Thirtieth Day of September, 2008

JON W. DUDAS
*Director of the United States Patent and Trademark Office*